(12) United States Patent
Kasai et al.

(10) Patent No.: US 9,936,305 B2
(45) Date of Patent: Apr. 3, 2018

(54) ACOUSTIC TRANSDUCER AND MICROPHONE USING THE ACOUSTIC TRANSDUCER

(75) Inventors: Takashi Kasai, Kustasu (JP); Shobu Sato, Ikoma (JP); Yuki Uchida, Otsu (JP); Igino Padovani, Novate Milanese (IT); Filippo David, Milan (IT); Sebastiano Conti, Mistretta (IT)

(73) Assignees: STMICROELECTRONICS S.R.L., Agrate Brianza (IT); OMRON CORPORATION, Kyoto-shi (JP)

( * ) Notice: Subject to any disclaimer, the term of this patent is extended or adjusted under 35 U.S.C. 154(b) by 1105 days.

(21) Appl. No.: 13/978,531

(22) PCT Filed: Dec. 22, 2011
(Under 37 CFR 1.47)

(86) PCT No.: PCT/JP2011/079843
§ 371 (c)(1),
(2), (4) Date: Nov. 12, 2013

(87) PCT Pub. No.: WO2012/093598
PCT Pub. Date: Jul. 12, 2012

(65) Prior Publication Data
US 2014/0191343 A1 Jul. 10, 2014

(30) Foreign Application Priority Data
Jan. 7, 2011 (JP) ................................. 2011-002313

(51) Int. Cl.
*B81B 3/00* (2006.01)
*H04R 19/04* (2006.01)
(Continued)

(52) U.S. Cl.
CPC ........... *H04R 19/04* (2013.01); *B81B 3/0021* (2013.01); *H04R 1/023* (2013.01); *H04R 3/00* (2013.01);
(Continued)

(58) Field of Classification Search
CPC .... H04R 19/005; H04R 19/016; H04R 19/04; H04R 3/00; H04R 3/005; H04R 31/00;
(Continued)

(56) References Cited

U.S. PATENT DOCUMENTS 3,588,382 A 6/1971 Reedyk
3,875,349 A 4/1975 Ruegg
(Continued)

FOREIGN PATENT DOCUMENTS

DE 43 42 169 A1 6/1995
EP 1385324 A1 1/2004
(Continued)

OTHER PUBLICATIONS

Office Action dated Mar. 16, 2015, for U.S. Appl. No. 13/936,104, pp. 19.
(Continued)

*Primary Examiner* — Nikolay Yushin
(74) *Attorney, Agent, or Firm* — Seed Intellectual Property Law Group LLP

(57) ABSTRACT

Provided is an acoustic transducer including: a semiconductor substrate; a vibrating membrane, provided above the semiconductor substrate, including a vibrating electrode; and a fixed membrane, provided above the semiconductor substrate, including a fixed electrode, the acoustic transducer detecting a sound wave according to changes in capacitances between the vibrating electrode and the fixed electrode, converting the sound wave into electrical signals, and outputting the electrical signals. At least one of the vibrating
(Continued)

electrode and the fixed electrode is divided into a plurality of divided electrodes, and the plurality of divided electrodes outputting the electrical signals.

32 Claims, 12 Drawing Sheets

(51) Int. Cl.
  *H04R 3/00* (2006.01)
  *H04R 19/00* (2006.01)
  *H04R 19/01* (2006.01)
  *H04R 31/00* (2006.01)
  *H04R 1/02* (2006.01)
  *H04R 1/08* (2006.01)

(52) U.S. Cl.
  CPC .......... *H04R 3/005* (2013.01); *H04R 19/005* (2013.01); *H04R 19/016* (2013.01); *H04R 31/00* (2013.01); *H04R 1/086* (2013.01); *H04R 2201/003* (2013.01); *H04R 2499/11* (2013.01)

(58) Field of Classification Search
  CPC .. H04R 1/023; H04R 1/086; H04R 2201/003; H04R 2499/11; B81B 3/0021; B81B 3/001; B81B 3/0072
  See application file for complete search history.

(56) References Cited

U.S. PATENT DOCUMENTS

| | | | |
|---|---|---|---|
| 4,776,019 A | 10/1988 | Miyatake | |
| 4,887,300 A | 12/1989 | Erling | |
| 5,388,163 A | 2/1995 | Elko et al. | |
| 5,452,268 A | 9/1995 | Bernstein | |
| 5,517,683 A | 5/1996 | Collett et al. | |
| 5,886,656 A | 3/1999 | Feste et al. | |
| 5,982,709 A | 11/1999 | Ladabaum et al. | |
| 6,101,258 A | 8/2000 | Killion et al. | |
| 6,271,780 B1 | 8/2001 | Gong et al. | |
| 6,449,593 B1 | 9/2002 | Valve | |
| 6,535,460 B2 | 3/2003 | Loeppert et al. | |
| 6,640,643 B2 | 11/2003 | Ishio et al. | |
| 6,731,767 B1 | 5/2004 | Blamey et al. | |
| 6,873,709 B2 | 3/2005 | Hou | |
| 6,882,734 B2 | 4/2005 | Watson et al. | |
| 6,944,474 B2 | 9/2005 | Rader et al. | |
| 6,950,528 B2 | 9/2005 | Fischer | |
| 7,003,127 B1 | 2/2006 | Sjursen et al. | |
| 7,016,508 B1 | 3/2006 | Phelps | |
| 7,146,016 B2 * | 12/2006 | Pedersen ............... B81B 3/0072 381/113 |
| 7,170,847 B2 | 1/2007 | De Jong et al. | |
| 7,181,030 B2 | 2/2007 | Rasmussen et al. | |
| 7,346,178 B2 | 3/2008 | Zhe et al. | |
| 7,359,504 B1 | 4/2008 | Reuss et al. | |
| 7,362,873 B2 | 4/2008 | Pedersen | |
| 7,539,613 B2 | 5/2009 | Takada | |
| 7,578,196 B2 | 8/2009 | Riccoti et al. | |
| 7,676,052 B1 | 3/2010 | Ma et al. | |
| 7,756,282 B2 | 7/2010 | Rass et al. | |
| 7,804,969 B2 | 9/2010 | Wang et al. | |
| 7,805,821 B2 | 10/2010 | Suzuki | |
| 7,813,517 B2 | 10/2010 | Klemenz et al. | |
| 7,825,483 B2 | 11/2010 | Nakatani et al. | |
| 7,836,770 B2 | 11/2010 | Goldberg et al. | |
| 7,856,283 B2 | 12/2010 | Burk et al. | |
| 7,856,804 B2 | 12/2010 | Laming et al. | |
| 7,888,840 B2 | 2/2011 | Shimaoka et al. | |
| 7,907,744 B2 | 3/2011 | Kasai et al. | |
| 8,045,733 B2 | 10/2011 | Zhe et al. | |
| 8,045,734 B2 | 10/2011 | Zhe et al. | |
| 8,072,010 B2 | 12/2011 | Lutz | |
| 8,150,084 B2 | 4/2012 | Jessen et al. | |
| 8,175,293 B2 | 5/2012 | Suvanto | |
| 8,194,881 B2 | 6/2012 | Haulick et al. | |
| 8,223,981 B2 | 7/2012 | Haila et al. | |
| 8,233,637 B2 | 7/2012 | Phelps et al. | |
| 8,243,962 B2 | 8/2012 | Qiao | |
| 8,270,634 B2 | 9/2012 | Harney et al. | |
| 8,284,958 B2 | 10/2012 | Suvanto et al. | |
| 8,327,711 B2 | 12/2012 | Kasai et al. | |
| 8,351,625 B2 | 1/2013 | Kasai | |
| 8,433,084 B2 | 4/2013 | Conti et al. | |
| 8,477,983 B2 | 7/2013 | Weigold et al. | |
| 8,934,649 B1 | 1/2015 | Lee et al. | |
| 8,942,394 B2 | 1/2015 | Conti et al. | |
| 9,036,838 B2 | 5/2015 | Chen et al. | |
| 9,374,644 B2 | 6/2016 | Kasai | |
| 2002/0057815 A1 | 5/2002 | Killion | |
| 2003/0210799 A1 | 11/2003 | Gabriel et al. | |
| 2007/0041597 A1 | 2/2007 | Song | |
| 2007/0121972 A1 | 5/2007 | Suzuki et al. | |
| 2007/0201710 A1 | 8/2007 | Suzuki et al. | |
| 2007/0222006 A1 | 9/2007 | Weber et al. | |
| 2008/0175399 A1 | 7/2008 | Kim et al. | |
| 2008/0192962 A1 | 8/2008 | Halteren | |
| 2008/0192963 A1 | 8/2008 | Sato | |
| 2008/0205668 A1 | 8/2008 | Torii et al. | |
| 2009/0002498 A1 | 1/2009 | Oku | |
| 2009/0095081 A1 | 4/2009 | Nakatani | |
| 2009/0208037 A1 | 8/2009 | Zhe | |
| 2010/0117485 A1 | 5/2010 | Martin et al. | |
| 2010/0158280 A1 | 6/2010 | Coronato et al. | |
| 2010/0254560 A1 | 10/2010 | Mehregany | |
| 2011/0140213 A1 | 6/2011 | Kasia et al. | |
| 2012/0093333 A1 | 4/2012 | Hu et al. | |
| 2012/0269363 A1 | 10/2012 | Suvanto | |
| 2013/0070942 A1 | 3/2013 | Kasai et al. | |
| 2013/0208923 A1 | 8/2013 | Suvanto | |
| 2013/0294622 A1 | 11/2013 | Kasai et al. | |
| 2014/0010374 A1 | 1/2014 | Kasai et al. | |

FOREIGN PATENT DOCUMENTS

| | | |
|---|---|---|
| FR | 2884101 A1 | 10/2006 |
| JP | 62-213400 A | 9/1987 |
| JP | 03-139097 A | 6/1991 |
| JP | 10-126886 A | 5/1998 |
| JP | 2005-110204 A | 4/2005 |
| JP | 2006-101302 A | 4/2006 |
| JP | 2008-005439 A | 1/2008 |
| JP | 2009-081624 A | 4/2009 |
| JP | 2009-098022 A | 5/2009 |
| JP | 2009-124474 A | 6/2009 |
| JP | 4419103 B1 | 2/2010 |
| JP | 2010-57167 A | 3/2010 |
| JP | 2011-4129 A | 1/2011 |
| SU | 1582361 A1 | 7/1990 |
| SU | 1670807 A1 | 8/1991 |
| WO | 2006/007441 A1 | 1/2006 |

OTHER PUBLICATIONS

Chinese Office Action dated May 27, 2015, for corresponding CN Application No. 201180064105.8 with English translation, 16 pages.

Office Action dated Sep. 2, 2014, for corresponding Japanese Application No. 2011-002313, with partial English Translation, 5 pages.

Kasai et al., *Novel Concept for a Mems Microphone With Dual Channels for an Ultrawide Dynamic Range*, MEMS 2011, Cancun, Mexico, Jan. 23-27, 2011, pp. 605-608.

Kasai et al., *Small Silicon Condenser Microphone Improved With a Backchamber With Concave Lateral Sides*, Digest Tech. Papers Transducers 2007 Conference, pp. 2613-2616.

Leinenbach et al., *A New Capacitive Type MEMS Microphone*, Proc. MEMS 2010, pp. 659-662.

Scheeper et al., *A Review of Silicon Microphones*, Sensors and Actuators A 44, 1994, pp. 1-11.

(56) References Cited

OTHER PUBLICATIONS

Weigold et al., *A MEMS Condenser Microphone for Consumer Applications*, MEMS 2006, Istanbul, Turkey, Jan. 22-26, 2006, pp. 86-89.

* cited by examiner

ACOUSTIC TRANSDUCER AND MICROPHONE USING THE ACOUSTIC TRANSDUCER

BACKGROUND

Technical Field

The present invention relates to an acoustic transducer that converts a sound wave into electrical signals, and to a microphone including the acoustic transducer. In particular, the present invention relates to a micro-sized acoustic transducer, which is fabricated by using a MEMS (Micro Electro Mechanical System) technology, and the like.

Description of the Related Art

Conventionally, an ECM (Electret Condenser Microphone) has been widely used as a miniature microphone mounted on a cellular (mobile) phone and the like. However, the ECM is weak against heat, and a MEMS microphone is superior to the ECM in terms of digitalization, miniaturization, enhancement of functionality/multi-functionality, and power saving. Accordingly, at present, the MEMS microphone is becoming widespread.

The MEMS microphone includes a capacitor-type acoustic sensor (acoustic transducer) that detects a sound wave and converts the detected sound wave into an electrical signal (detection signal), a drive circuit that applies a voltage to the acoustic sensor, and a signal processing circuit that performs signal processing such as amplification on the detection signal from the acoustic sensor and outputs the processed detection signal to outside. The acoustic sensor is manufactured by using MEMS technology. The drive circuit and the signal processing circuit are manufactured integrally with each other as an ASIC (Application Specific Integrated Circuit) by using a semiconductor manufacturing technology.

Recently, the microphone has been required to detect and output a large sound with high quality. In general, a maximum input sound pressure (dynamic range) is restricted by a total harmonic distortion (hereinafter, referred to as "THD"). This is because attempting to detect a large sound by the microphone results in generation of a harmonic distortion in an output signal, thereby leading to deterioration of sound quality. Namely, if the THD can be reduced, then the maximum input sound pressure can be increased.

However, in a general microphone, detection sensitivity for the sound wave and the THD have a trade-off relationship therebetween. Therefore, a high-sensitivity microphone has a large THD, so as to have a small maximum input sound pressure. This is because the high-sensitivity microphone tends to output a large signal and therefore is likely to cause the THD. Meanwhile, a low-sensitivity microphone causes a small THD, so as to have a large maximum input sound pressure. However, it is difficult for the low-sensitivity microphone to detect a small sound with high quality.

In order to cope with these problems, such a microphone which uses a plurality of acoustic sensors having respective different sensitivities has been studied (for example, refer to U.S. Pat. Nos. 8,223,981 and 8,233,637, U.S. Patent Application Publication 2007/0047746 (published on Mar. 1, 2007), and Japanese Unexamined Patent Publication No. 2008-245267 (published on Oct. 9, 2008)).

Each of U.S. Pat. Nos. 8,223,981 and 8,233,637 discloses a microphone including a plurality of acoustic sensors, wherein the plurality of acoustic sensors output a plurality of signals and the plurality of signals are switched or combined in response to a sound pressure. In particular, U.S. Pat. No. 8,223,981 discloses a microphone including a high-sensitivity acoustic sensor whose detectable sound pressure level (SPL) ranges from 20 dB to 110 dB and a low-sensitivity acoustic sensor whose detectable sound pressure level ranges from 50 dB to 140 dB, wherein the microphone uses the high-sensitivity acoustic sensor and the low-sensitivity acoustic sensor in a switching manner so as to achieve a detectable sound pressure level ranging from 20 dB to 140 dB. Moreover, each of Japanese Unexamined Patent Publication No. 2008-245267 and U.S. Patent Application Publication No. 2007/0047746 discloses a configuration including a plurality of acoustic sensors independently provided on a single chip.

However, according to the above configuration described in each of Japanese Unexamined Patent Publication No. 2008-245267 and U.S. Patent Application Publication No. 2007/0047746, the acoustic sensors are formed independently of one another, and therefore there occur a variation and mismatching in their acoustic characteristics. Here, the expression "variation in the acoustic characteristics" refers to a difference between the chips with regard to the acoustic characteristics of the acoustic sensor. The expression "mismatching in the acoustic characteristics" refers to a difference between the plurality of acoustic sensors in a single chip with regard to the acoustic characteristics.

Specifically, the acoustic sensors have thin films warped in respective different manners, so that variations in the detection sensitivity occur between the chips independently. As a result, there occurs a large variation between the chips in the difference between the in detection sensitivities among the acoustic sensors. Further, the acoustic sensors have their respective back chambers and vent holes. Since the acoustic characteristics such as frequency characteristics and phases are affected by the back chamber and the vent hole, mismatching in the acoustic characteristics occurs in the chip.

BRIEF SUMMARY

The present embodiment describes an acoustic transducer which is capable of converting a sound wave into a plurality of electrical signals, and is capable of reducing the variations between the chips and the mismatching in the chip with regard to the acoustic characteristics.

In accordance with one aspect, an acoustic transducer includes a substrate; a vibrating membrane, provided above the substrate, including a vibrating electrode; and a fixed membrane, provided above the substrate, including a fixed electrode, the acoustic transducer detecting a sound wave according to changes in capacitance between the vibrating electrode and the fixed electrode, converting the sound wave into electrical signals, and outputting the electrical signals, at least one of the vibrating electrode and the fixed electrode being divided into a plurality of divided electrodes and the plurality of divided electrodes outputting the electrical signals.

In accordance with the above configuration, at least one of the vibrating electrode and the fixed electrode is divided into divided electrodes, whereby a plurality of variable capacitors are formed between the vibrating electrode and the fixed electrode. This makes it possible to provide an acoustic transducer in which the plurality of divided electrodes respectively output the plurality of electrical signals, so that the sound wave is converted into the plurality of electrical signals.

Moreover, the plurality of variable capacitors are formed between the same vibrating membrane and the same fixed membrane. Hence, according to the present invention, the chips have similar variations between the detection sensitivities of the respective variable capacitors, in comparison with the conventional technique by which the plurality of vibrating membranes and the plurality of fixed membranes are provided independently. This makes it possible to reduce the variation between the chips with regard to the difference between the detection sensitivities of the variable capacitors. Moreover, the variable capacitors share the vibrating membrane and the fixed membrane. This makes it possible to reduce, in the chip, the mismatching in the acoustic characteristics such as the frequency characteristics and the phases.

As described above, according to the acoustic transducer of the present invention, at least one of the vibrating electrode and the fixed electrode is divided into a plurality of divided electrodes, whereby the plurality of variable capacitors are formed between the vibrating electrode and the fixed electrode. This makes it possible to provide the acoustic transducer in which the plurality of divided electrodes respectively output a plurality of electrical signals, so that the sound wave is converted into the plurality of electrical signals. Moreover, the plurality of variable capacitors are formed between the same vibrating membrane and the same fixed membrane. This makes it possible to reduce the variation between the chips with regard to the difference between the detection sensitivities of the variable capacitors, and to reduce, in the chip, the mismatching in the acoustic characteristics such as the frequency characteristics and the phases.

DETAILED DESCRIPTION

First Embodiment

The following describes an embodiment of the present invention with reference to FIGS. 1A to 3. FIGS. 2A to 2C show a schematic configuration of a MEMS microphone of this embodiment. FIG. 2A is a plan view showing the MEMS microphone whose upper portion is cut away. FIGS. 2B and 2C are front views showing the MEMS microphones whose front portions are cut away. Note that FIG. 2C is a modification of the configuration shown in FIG. 2B.

Figure 2A:
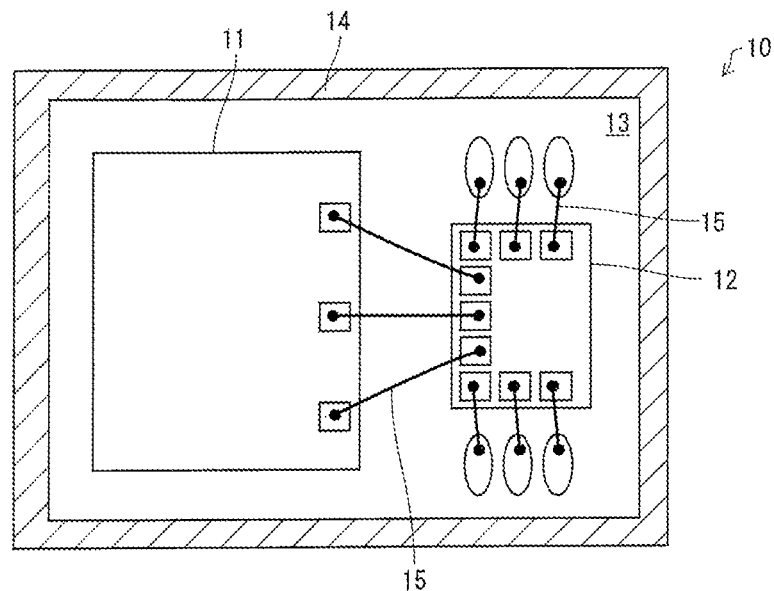
FIGS. 2A to 2C are a plan view and cross-sectional views, which show a schematic configuration of the MEMS microphone.

As shown in FIG. 2A, the MEMS microphone 10 includes an acoustic sensor (acoustic transducer) 11, an ASIC 12, a wiring board 13, and a cover 14.

The acoustic sensor 11 detects a sound wave and coverts the sound wave into electrical signals (detection signals). The acoustic sensor 11 is a MEMS chip manufactured by using a MEMS technique. The ASIC 12 is an integrated circuit (IC) that has a power supply function to supply power to the acoustic sensor 11 and a signal processing function to appropriately process the electrical signal from the acoustic sensor 11 and output the electrical signal to outside. The ASIC 12 is a semiconductor chip manufactured by using a semiconductor technique. The acoustic sensor 11 and the ASIC 12 are arranged on the wiring board 13, and are covered with the cover 14.

Electrical connection between the wiring board 13, the acoustic sensor 11, and the ASIC 12 is typically made by metal wires 15; however, can alternatively be made by gold bump bonding or the like. The wiring board 13 is provided with connection terminals 16 for electrically connecting the wiring board 13 to the outside. The connection terminals 16 are used to receive power supplied from the outside, to output a signal to the outside, and the like. The wiring board 13 is mounted to a variety of devices typically by surface reflow soldering, and is electrically connected thereto by the connection terminals 16.

Figure 2B:
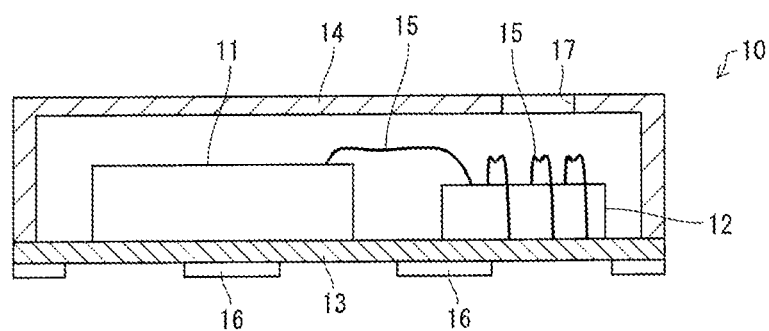
Figure 2C:
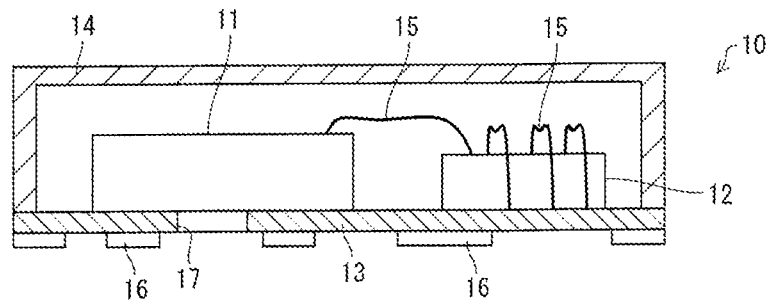

The cover 14 has a function to protect the acoustic sensor 11 and the ASIC 12 from noise, physical contact, and the like from the outside. Therefore, the cover 14 has an electromagnetic shield layer provided on its outer layer or in its inside. Moreover, the cover 14 has a through hole 17 through which an external sound wave reaches the acoustic sensor 11. In FIG. 2B, the though hole 17 is provided in an upper side of the cover 14. Alternatively, the through hole 17 may be provided in a lateral side of the cover 14, or may be provided, as shown in FIG. 2C, in a region of the wiring board 13, on which region the acoustic sensor 11 is provided.

Figure 1A:
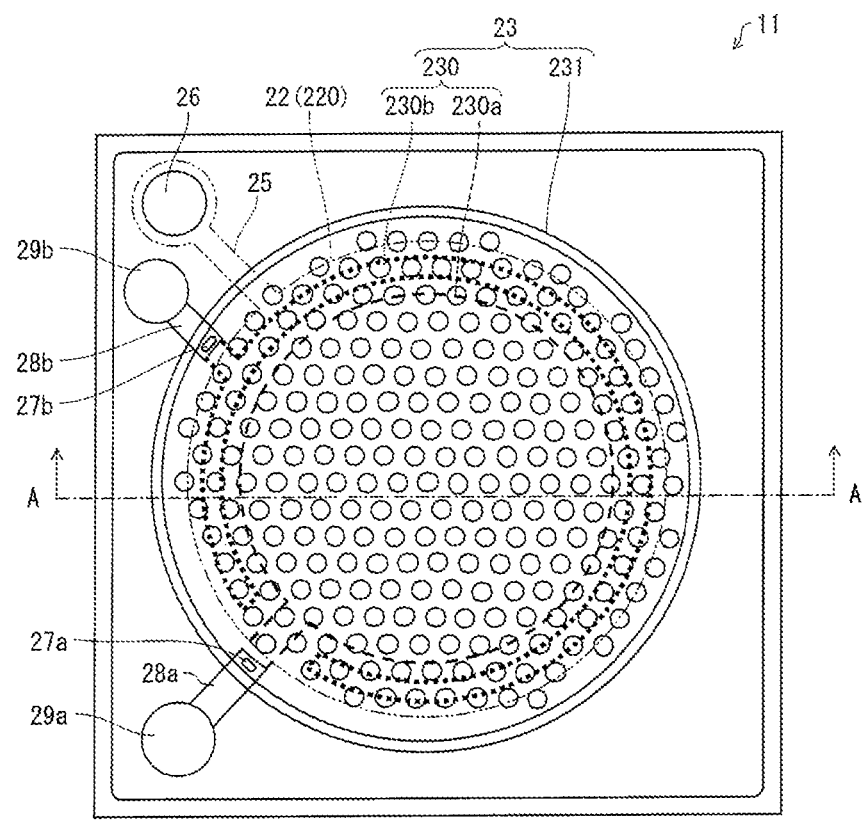
FIGS. 1A and 1B are a plan view and a cross-sectional view, which show a schematic configuration of an acoustic sensor in a MEMS microphone according to an embodiment of the present invention.
Figure 1B:
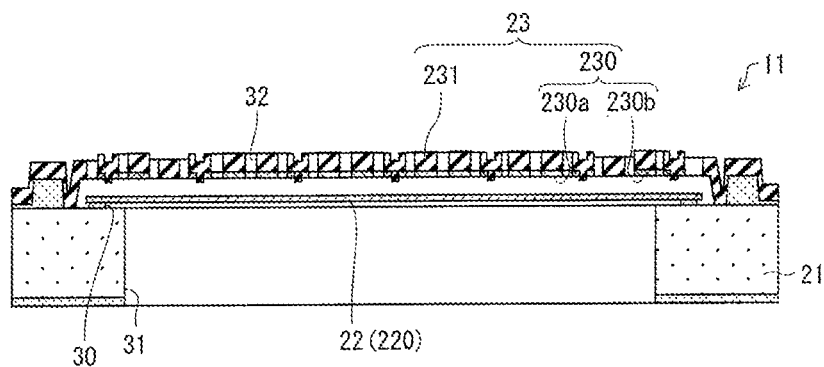

FIGS. 1A and 1B show a schematic configuration of the acoustic sensor 11 in this embodiment. FIG. 1A is a plan view of the acoustic sensor 11, and FIG. 1B is a cross-sectional view of the acoustic sensor 11, taken along line A-A shown in FIG. 1A and viewed in an arrow direction shown in FIG. 1A.

As shown in FIGS. 1A and 1B, the acoustic sensor 11 includes a semiconductor substrate 21, a vibrating membrane 22 provided on an upper surface of the semiconductor substrate 21, and further, a fixed membrane 23 provided so as to cover the vibrating membrane 22. The vibrating membrane 22 is a conductor, and functions as a vibrating electrode 220. Meanwhile, the fixed membrane 23 includes a fixed electrode 230 that is a conductor, and a protecting membrane 231 that is an insulator for protecting the fixed electrode 230. The vibrating electrode 220 and the fixed electrode 230 are facing each other with a gap therebetween, and function as a capacitor.

An edge portion of the vibrating membrane 22 is attached onto the semiconductor substrate 21 via an insulating layer 30 therebetween. The insulating layer 30 is disposed between the edge portion of the vibrating membrane 22 and the semiconductor substrate 21 so that the edge portion of the vibrating membrane 22 and the semiconductor substrate 21 are apart from each other at a certain interval. This provides a gap (vent hole) between the edge portion of the vibrating membrane 22 and the semiconductor substrate 21.

Moreover, the semiconductor substrate 21 has an opening (back chamber) 31 in which a part of the semiconductor substrate 21 faces a center of the vibrating membrane 22. Furthermore, the fixed membrane 23 has a large number of sound hole portions 32 each having a sound hole. Typically, the sound hole portions 32 are arranged regularly at equal intervals, and the sound holes of the respective sound hole portions 32 have substantially the same size.

In the configuration of FIG. 2B, a sound wave will pass through the through hole 17 and the sound hole portions 32 of the fixed membrane 23, and will reach the vibrating membrane 22. Moreover, in the case of FIG. 2C, the through hole 17 and the opening 31 of the acoustic sensor 11 are connected to each other, and the sound wave will pass through the through hole 17 and the opening 31, and will reach the vibrating membrane 22. In comparison with the case of FIG. 2B, the configuration of FIG. 2C makes it possible to reduce deteriorations of sensitivity and frequency characteristics occurring due to a volume effect of the opening 31.

In the acoustic sensor 11 having the above configuration, an external sound wave reaches the vibrating membrane 22 through the sound hole portions 32 of the fixed membrane 23 or through the opening 31. At this time, the vibrating membrane 22 vibrates upon application of a sound pressure of the sound wave that has reached the vibrating membrane 22. This changes an interval (air gap) between the vibrating electrode 220 and the fixed electrode 230, thereby changing a capacitance between the vibrating electrode 220 and the fixed electrode 230. By converting the change of the capacitance into a change in a voltage or a current, the acoustic sensor 11 can detect the external sound wave and convert the detected sound wave into electrical signal (detection signal).

The acoustic sensor 11 having the above configuration includes the fixed membrane 23 having the large number of sound hole portions 32. Besides allowing the external sound wave to pass therethrough to reach the vibrating membrane 22, the sound hole portions 32 have the following functions:

(1) The sound hole portions 32 allow the sound wave that has reached the fixed membrane 23 to pass through, so that the sound pressure applied to the fixed membrane 23 is reduced.

(2) The sound hole portions 32 allow the air between the vibrating membrane 22 and the fixed membrane 23 to go in and out through the sound hole portions 32. This results in a reduction in thermal noise (air fluctuations). Moreover, this reduces damping of the vibrating membrane 22, which is caused by the air, thereby reducing deterioration of high frequency characteristics that may be caused by the damping.

(3) The sound hole portions 32 can be used as etching holes for forming the gap between the vibrating electrode 220 and the fixed electrode 230 by a surface micromachining technique.

In this embodiment, the semiconductor substrate 21 is a semiconductor, which has a thickness of approximately 400 µm, and is made from monocrystalline silicon and the like. The vibrating membrane 22 is a conductor, which has a thickness of approximately 0.7 µm, and is made from polycrystalline silicon and the like. The vibrating membrane 22 functions as the vibrating electrode 220. The fixed membrane 23 includes the fixed electrode 230 and the protecting membrane 231. The fixed electrode 230 is a conductor, which has a thickness of approximately 0.5 µm, and is made from polycrystalline silicon and the like. The protecting membrane 231 is an insulator, which has a thickness of approximately 2 µm, and is made from silicon nitride and the like. Moreover, the gap between the vibrating electrode 220 and the fixed electrode 230 is approximately 4 µm.

In this embodiment, as shown in FIGS. 1A and 1B, the fixed electrode 230 is divided into a center electrode 230a provided on a center portion of the fixed membrane 23, and a peripheral electrode 230b provided on a peripheral portion of the fixed membrane 23, and the center electrode 230a and the peripheral electrode 230b are electrically isolated from each other. The central electrode 230a is connected to a connection terminal 29a through a contact portion 27a and a wiring strip 28a. Meanwhile, the peripheral electrode 230b is connected to a connection terminal 29b through a contact portion 27b and a wiring strip 28b. Note that the vibrating electrode 220 is connected to a connection terminal 26 through the wiring strip 25.

Thus, the capacitor made of the vibrating electrode 220 and the fixed electrode 230 is divided into (i) a center capacitor, which is made of the center electrode 230a and the center portion of the vibrating electrode 220, and (ii) a peripheral capacitor, which is made of the peripheral electrode 230b and the peripheral portion of the vibrating electrode 220. Thus, the acoustic sensor 11 of this embodiment is capable of converting an external sound wave into an electrical signal from the center capacitor and an electrical signal from the peripheral capacitor.

Since, the vibrating membrane 22 is fixed at the edge portions, the center portion of the vibrating membrane 22 is displaced in a large amount as a result of vibration, and the peripheral portion of the vibrating membrane 22 is displaced in a small amount as a result of vibration. Thus, the center capacitor serves as a high-sensitivity capacitor having a high detection sensitivity, and the peripheral capacitor serves as a low-sensitivity capacitor having a low detection sensitivity. Hence, the acoustic sensor 11 of this embodiment is capable of converting an external sound wave into two electrical signals with different detection sensitivities. In this manner, the acoustic sensor 11 of this embodiment achieves an expanded detectable sound pressure level, in comparison with the conventional acoustic sensor including only one variable capacitor. Moreover, the central electrode 230a has a wider area than the peripheral electrode 230b. Accordingly, this makes it possible to expand the detectable sound pressure level.

Moreover, in this embodiment, the fixed electrode 230 is divided, but the vibrating membrane 22 and the protecting membrane 231 are in a single part. Thus, in comparison with the conventional acoustic sensor including the separate vibrating membrane and the separate protecting membrane, the chips have similar variations between the detection sensitivities of the center capacitor and the peripheral capacitor. This makes it possible to reduce variations between the chips with regard to the difference between the detection sensitivities of the center capacitors and the peripheral capacitors.

Moreover, the center capacitor and the peripheral capacitor share the vibrating membrane 22 and the protecting membrane 231. This makes it possible to reduce, in the chip mismatching in acoustic characteristics such as frequency characteristics and phases. Furthermore, the center capacitor and the peripheral capacitor share the back chamber, the air gap, and the vent hole. This makes it possible to further reduce, in the chip, the mismatching in the acoustic characteristics.

Incidentally, in the case of the above configuration described in each of Japanese Unexamined Patent Publication No. 2008-245267 and U.S. Patent Application Publication No. 2007/0047746, the plurality of independent acoustic sensors are formed on one chip and as such, a size of the chip is increased. Moreover, the configuration has an increased number of the longer wires extending from the respective acoustic sensors to the ASIC, thereby resulting in an increase in a parasitic capacitance and a parasitic resistance. This leads to deterioration of various characteristics (such as, the detection sensitivity and SNR (signal-to-noise ratio)).

As opposed to this, in this embodiment, the center capacitor and the peripheral capacitor are formed between the vibrating membrane 22 and the fixed membrane 23. Therefore, as compared with the conventional technique, this embodiment can reduce the size of the chip and reduce a length of the wires, thereby making it possible to prevent deterioration of the various characteristics.

Moreover, in this embodiment, the air gap is constant in size while the vibrating membrane 22 stands still. This makes it possible to further reduce, in the chip, the mismatching in the acoustic characteristics, since the center capacitor and the peripheral capacitor are provided in the same interval between the vibrating electrode 220 and the fixed electrode 230. According to this embodiment, it is possible to simplify a step of forming the vibrating electrode 220 and the fixed electrode 230 in the manufacturing process of the acoustic sensor 11.

Moreover, in this embodiment, each of the vibrating electrode 220 and the fixed electrode 230 is formed to have a uniform thickness. This allows the chips to have more similar variations between the detection sensitivities of the center capacitor and the peripheral capacitor where the variations are caused by fabrication. This makes it possible to reduce the variation between the chips with regard to the difference between the detection sensitivity of the center capacitors and the peripheral capacitors.

Moreover, in this embodiment, the vibrating membrane 22 has a base portion that is circular. In comparison with a vibrating membrane having a base portion that is rectangular or square, the vibrating membrane 22 of this embodiment can reduce a concentration of a stress. As a result, durability against an external stress and an internal stress is enhanced.

Moreover, in this embodiment, the vent hole is present. Accordingly, in comparison with a configuration in which the vent hole is not present, the displacement of the vibrating membrane can be increased, and the detection sensitivity can be enhanced. Moreover, this configuration makes the vibrating membrane less likely to be warped by external force and the like. Accordingly, the acoustic characteristics are less likely to be varied and an influence by variations of an outside air pressure are reduced.

Note that a method of manufacturing the acoustic sensor 11 of this embodiment is different from the method of manufacturing the conventional acoustic sensor only in terms of a mask for forming the center electrode 230a. Specifically, by the mask of this embodiment, the center electrode 230a and the peripheral electrode 230b are formed separately.

That is, first, a sacrificial layer ($SiO_2$) is formed on an upper surface of a monocrystalline silicon substrate serving as the semiconductor substrate 21. Next, a polycrystalline silicon layer is formed and etched on the sacrificial layer, whereby the vibrating membrane 22 is formed. Next, another sacrificial layer is formed so as to cover the vibrating membrane 22.

Next, a polycrystalline silicon layer and a silicon nitride layer are formed so as to cover the sacrificial layer and then etched, whereby the fixed membrane 23 including the fixed electrode 230 and the protecting membrane 231 is formed. Here, the polycrystalline silicon layer is formed so as to be separated into a center portion and a peripheral portion by a mask pattern and the like, whereby the fixed electrode 230 is formed separately as the center electrode 230a and the peripheral electrode 230b.

Next, the monocrystalline silicon substrate is etched, whereby the opening 31 is formed. Then the sacrificial layer is etched through the sound hole portions 32, whereby the air gap between the vibrating membrane 22 and the fixed membrane 23 is formed, the insulating layer 30 is formed, and thus, the acoustic sensor 11 is completed.

Figure 3:
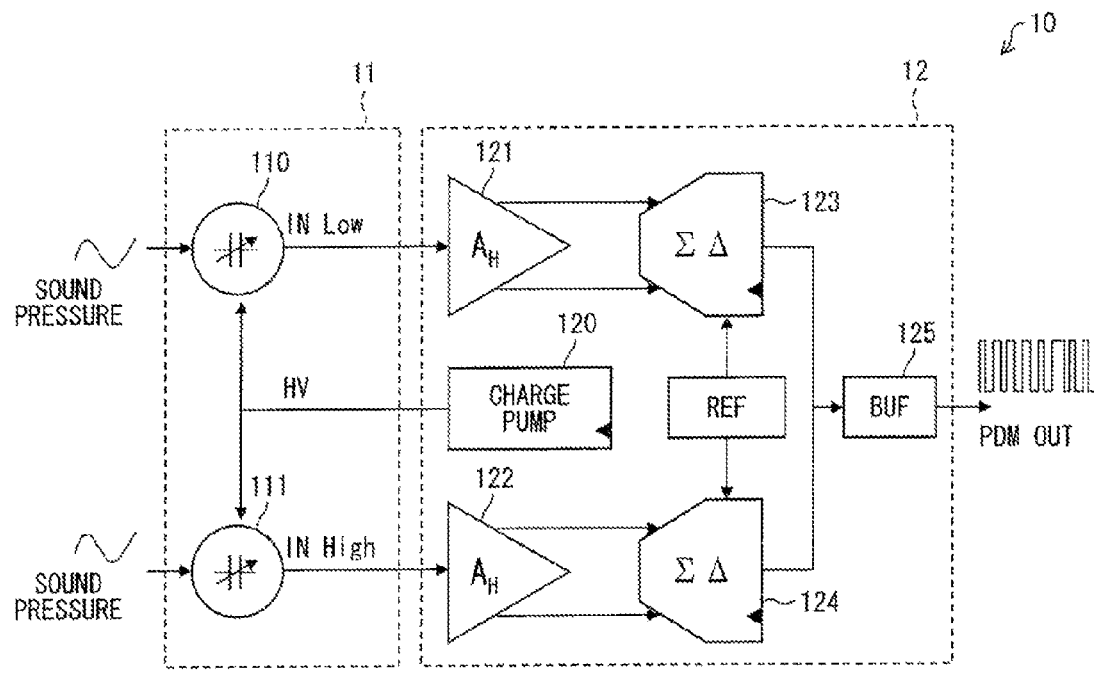
FIG. 3 is a circuit diagram of the MEMS microphone.

FIG. 3 is a circuit diagram of the MEMS microphone 10 shown in FIG. 2A. As shown in FIG. 3, the acoustic sensor 11 includes a low-sensitivity variable capacitor 110 and a high-sensitivity variable capacitor 111, each of which has a capacitance that is changed by the sound wave. The low-sensitivity variable capacitor 110 corresponds to the peripheral capacitor, and the high-sensitivity variable capacitor 111 corresponds to the central capacitor.

Moreover, the ASIC 12 includes a charge pump 120, an amplifier 121 for a low-sensitivity variable capacitor, an amplifier 122 for a high-sensitivity variable capacitor, a ΣΔ (sigma-delta, ΣΔ-type) ADCs (Analog-to-Digital Converters) 123 and 124, and a buffer 125.

A high voltage HV outputted from the charge pump 120 is applied to the variable capacitors 110 and 111 of the acoustic sensor 11, whereby the sound wave is converted into electrical signals by the variable capacitors 110 and 111. The electrical signal converted by the low-sensitivity variable capacitor 110 is amplified by the amplifier 121 for the low-sensitivity variable capacitor, and is converted into a digital signal by the ΣΔ-type ADC 123. In a similar manner, the electrical signal converted in the high-sensitivity variable capacitor 111 is amplified in the amplifier 122 for the high-sensitivity variable capacitor, and is converted into a digital signal by the ΣΔ-type ADC 124. The digital signals converted by the ΣΔ-type ADCs 123 and 124 are outputted as PDM (pulse density modulation) signals through the buffer 125 to the outside.

Note that, in the example of FIG. 3, two digital signals obtained as a result of the conversion by the ΣΔ-type ADCs 123 and 124 are described as being combined with each other and are outputted to a single data line. Alternatively, the two digital signals may be outputted to different data lines.

In this embodiment, the fixed electrode 230 is divided, and the vibrating electrode 220 is not divided. In this case, in comparison with the configuration where both of the fixed electrode 230 and the vibrating electrode 220 are divided, this embodiment has fewer connections to the ASIC 12 so that productivity is enhanced. Moreover, the number of connection terminals to the ASIC 12 is decreased, which makes it possible to reduce the parasitic capacitance caused by the connection terminals, so as to improve the characteristics. Moreover, only a single voltage is applied from the charge pump 120 to the variable capacitors. Accordingly, the size of the ASIC 12 including the charge pump 120 can be reduced, a manufacturing cost can be reduced, and variations in the difference between the detection sensitivities can be reduced, where the variation is caused by variations in the charge pump 120 from fabrication.

Second Embodiment

Figure 4A:
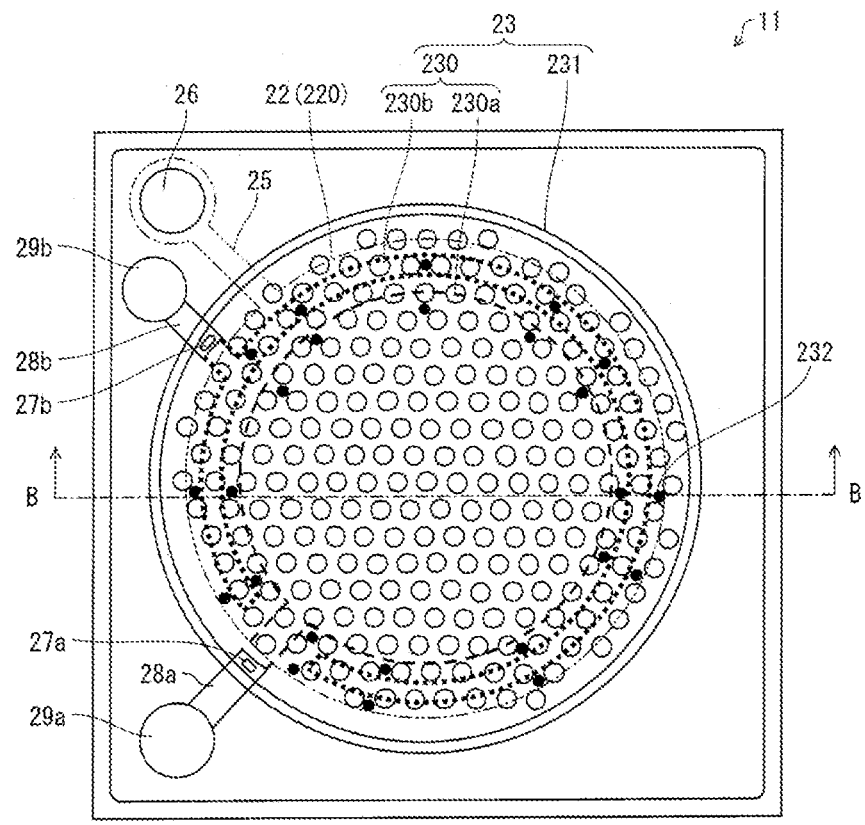
FIGS. 4A and 4B are a plan view and a cross-sectional view, which show a schematic configuration of an acoustic sensor in a MEMS microphone according to another embodiment of the present invention.
Figure 4B:
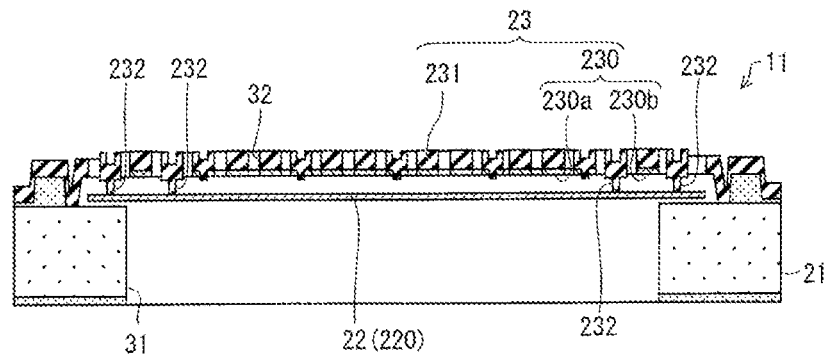

Next, a description is made of another embodiment of the present invention with reference to FIGS. 4A and 4B. FIGS. 4A and 4B show a schematic configuration of an acoustic sensor 11 according to this embodiment; where FIG. 4A is a plan view of the acoustic sensor 11, and FIG. 4B is a cross-sectional view of the acoustic sensor 11, taken along line B-B of FIG. 4A and viewed in an arrow direction thereof.

The acoustic sensor 11 shown in FIGS. 4A and 4B is different from the acoustic sensor 11 shown in FIGS. 1A and 1B in that the insulating layer 30 is not present and an edge of a vibrating membrane 22 is not fixed to a semiconductor substrate 21, and that protruding portions 232 extending from a protecting membrane 231 of a fixed membrane 23 to the vibrating membrane 22, are provided so as to be apart from each other along a peripheral electrode 230b. The acoustic sensor 11 shown in FIGS. 4A and 4B is similar to the acoustic sensor 11 shown in FIGS. 1A and 1B in other components. Note that the same reference numerals are denoted to components having similar functions to those of the components described in the above embodiment, and a description thereof is omitted.

The vibrating membrane 22 is not fixed to the semiconductor substrate 21. However, upon application of a voltage between the vibrating membrane 22 (vibrating electrode 220) and the fixed electrode 230, the vibrating membrane 22 is held by the protruding portions 232 by electrostatic forces. Therefore, influences from an external stress and an internal stress applied to the vibrating membrane 22 are reduced. Moreover, the protruding portions 232 restrict vibrations of a peripheral portion of the vibrating membrane 22. Accordingly, it is possible to reduce a detection sensitivity of a peripheral capacitor which is made of the peripheral electrode 230b and the peripheral portion of the vibrating electrode 220. As a result, it is possible to further increase a sensitivity difference between the detection sensitivity of the center capacitor and the detection sensitivity of the peripheral capacitor.

Third Embodiment

Figure 5:
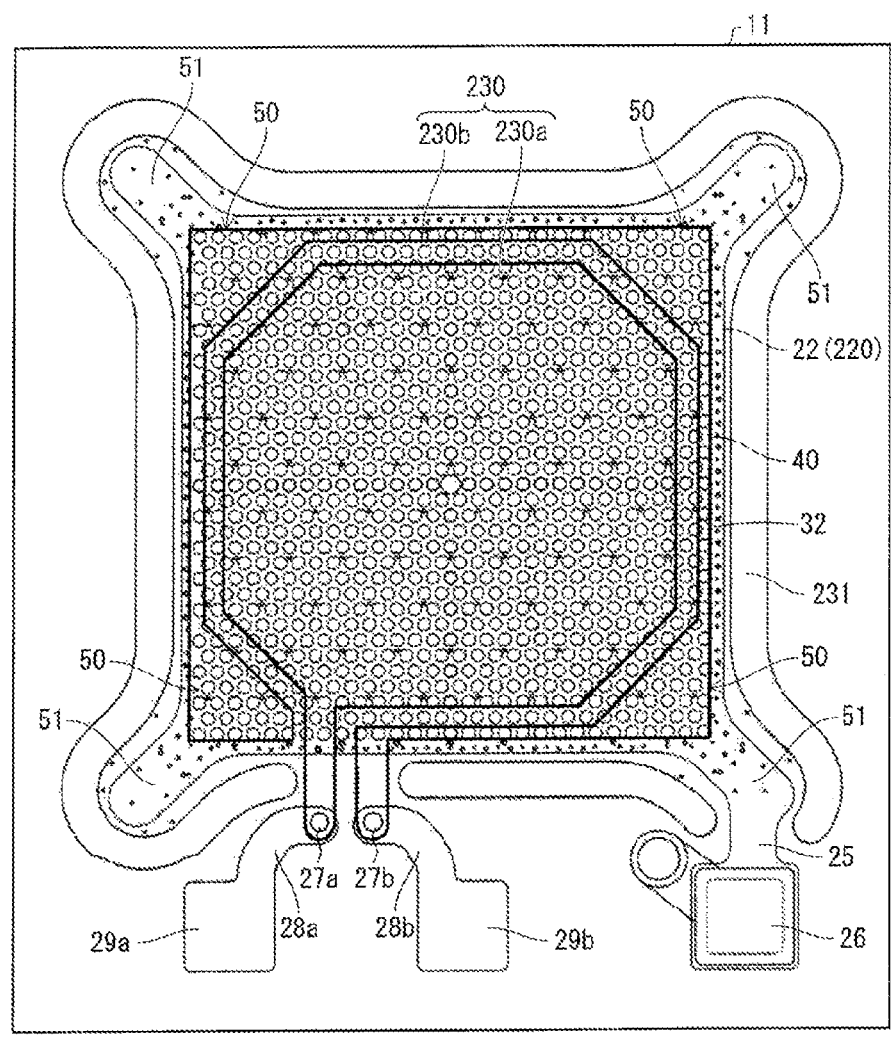
FIG. 5 is a plan view showing a schematic configuration of an acoustic sensor in a MEMS microphone according to still another embodiment of the present invention.
Figure 6:
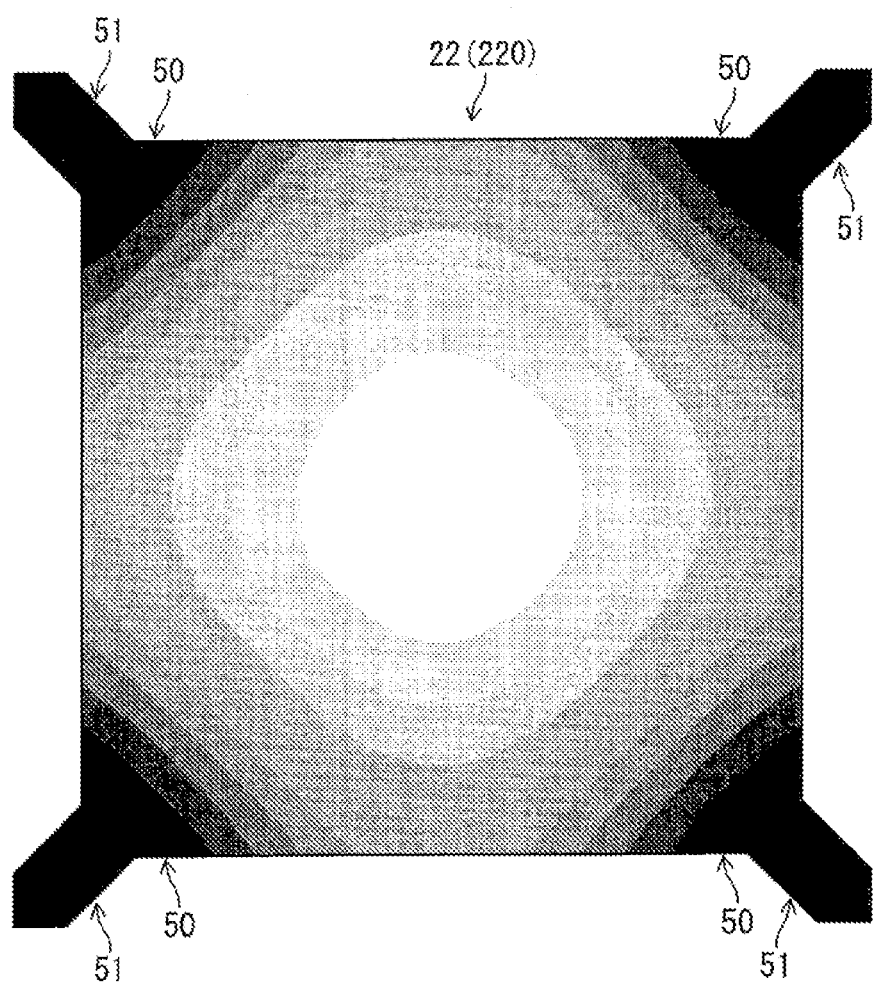
FIG. 6 is a plan view showing a vibration amount of a vibrating membrane of the acoustic sensor.

Next, a description is made of still another embodiment of the present invention with reference to FIG. 5 and FIG. 6. FIG. 5 is a plan view showing a schematic configuration of an acoustic sensor 11 according to this embodiment. Note that, in FIG. 5, the protecting membrane 231 of the fixed membrane 23 is omitted.

The acoustic sensor 11 shown in FIG. 5 is different in the shape of the vibrating membrane 22 from the acoustic sensor shown in FIGS. 1A and 1B, and therefore, is different therefrom also in the shape of the fixed membrane. Note that other components of the acoustic sensor 11 shown in FIG. 5 are similar to those of the acoustic sensor shown in FIGS. 1A and 1B.

The vibrating membrane 22 of the acoustic sensor 11 shown in FIGS. 1A and 1B is circular and has the edge portion fixed to the substrate 21. On the other hand, as shown in FIG. 5, the vibrating membrane 22 of the acoustic sensor 11 of this embodiment has a base portion having a substantially square shape having corner portions 50 each extending outward from a center of the vibrating membrane 22, so that the vibrating membrane 22 is fixed to the semiconductor substrate 21 at such extended portions 51.

FIG. 6 shows an amount that the vibrating membrane 22 vibrates, which is observed when a predetermined sound wave reaches the vibrating membrane 22. In FIG. 6, a region which vibrates in a larger amount is shown to be brighter. As shown in FIG. 6, the vibrating membrane 22 vibrates in a small amount in the corner portions 50 and the extended portions 51. Thus, as shown in FIG. 5, the fixed electrode 230 of this embodiment is substantially square. In the fixed electrode 230, a center portion serves as the center electrode 230a, and the corner portions and connection portions by which the corner portions are connected to each other serve as the peripheral electrode 230b. As such, no matter what shape the vibrating membrane 22 (vibrating electrode 220) may have, the center electrode 230a only needs to be formed so as to be facing the center region of the vibrating membrane 22, and the peripheral electrode 230b only needs to be formed so as to be facing the vicinity of a region of the vibrating membrane 22 at which the vibrating membrane is fixed to the semiconductor substrate 21.

In this embodiment, the base portion of the vibrating membrane 22 is square. This allows effective use of an upper area of a rectangle or square chip. Moreover, in comparison with the vibrating membrane 22 in which the base portion is circular, the vibrating membrane 22 having the square base portion allows for a variety of ways in which the fixed portion may be arranged to fix the vibrating membrane 22 and the semiconductor substrate 21 to each other. Accordingly, the detection sensitivity can be varied as well. Moreover, in comparison with the vibrating membrane 22 in which the base portion is circular, the vibrating membrane 22 having a square base portion deforms in a substantial plate shape and substantially in parallel with the fixed membrane 23 upon arrival of the sound wave at the vibrating membrane 22. The variable capacitor functions as a capacitor similar to a parallel plate capacitor, which is made of electrodes disposed at an interval being variable depending on a sound pressure. As a result, a change of the capacitance has good linearity with respect to the sound pressure.

Fourth Embodiment

Figure 7:
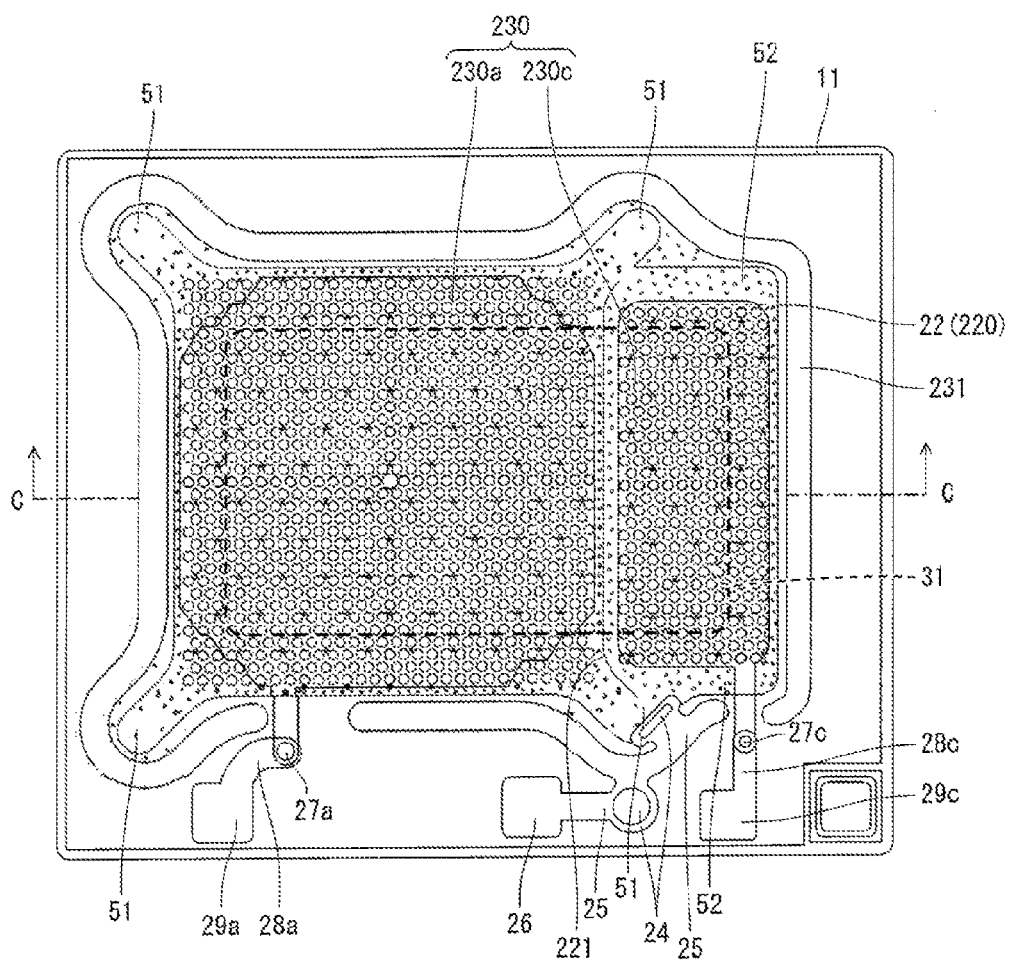
FIG. 7 is a plan view showing a schematic configuration of an acoustic sensor in a MEMS microphone according to still another embodiment of the present invention.
Figure 8:
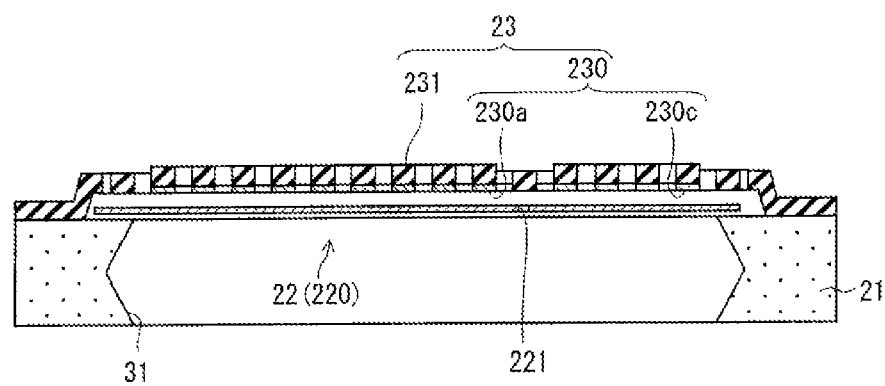
FIG. 8 is a cross-sectional view of the acoustic sensor.
Figure 9:
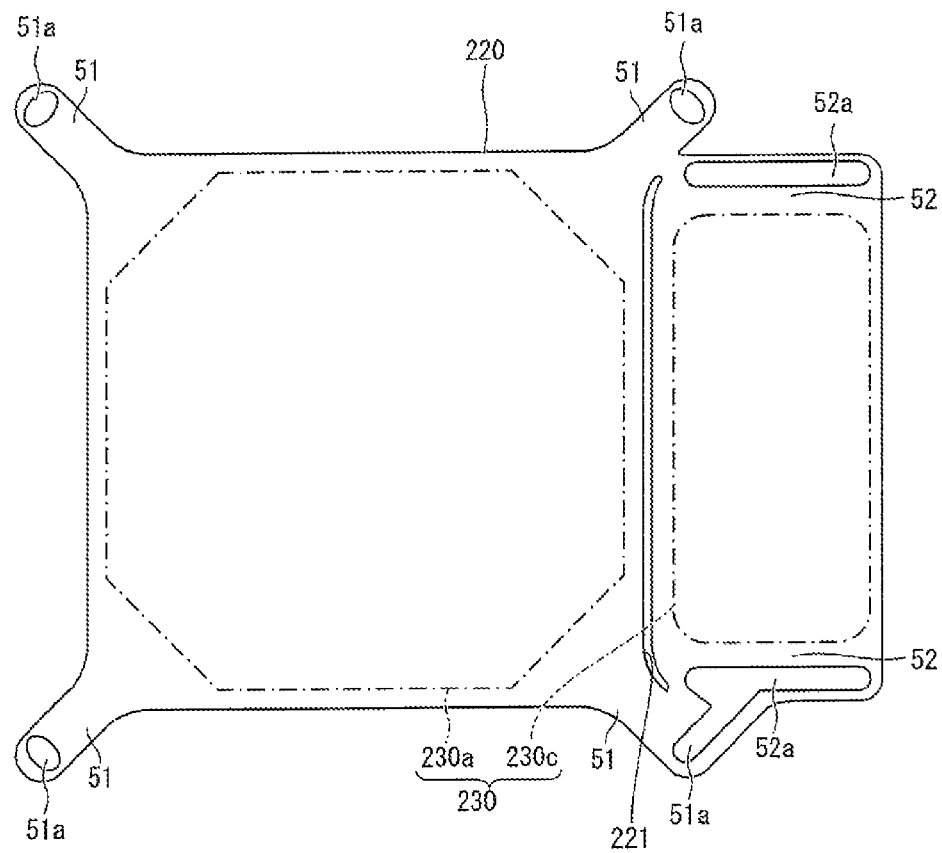
FIG. 9 is a plan view showing a schematic configuration of a vibrating membrane in the acoustic sensor.
Figure 10:
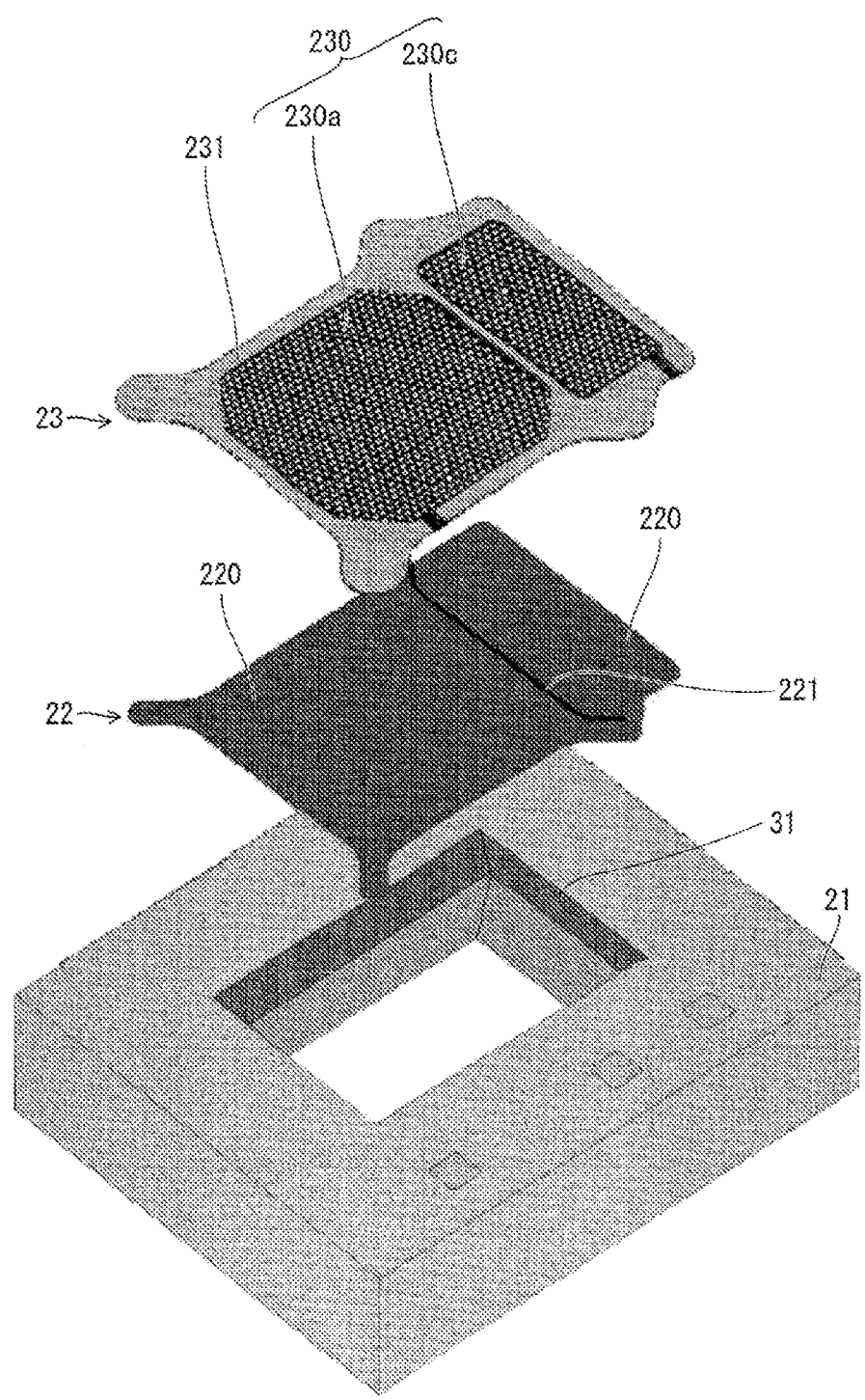
FIG. 10 is an exploded assembly view of the acoustic sensor.

A description will be made of still another embodiment of the present invention with reference to FIG. 7 to FIG. 12. FIG. 7 is a plan view showing a schematic configuration of an acoustic sensor 11 according to this embodiment, and FIG. 8 is a cross-sectional view of the acoustic sensor 11, taken along line C-C of FIG. 7 and viewed in an arrow direction thereof. FIG. 9 is a plan view showing a schematic configuration of a vibrating membrane 22 in the acoustic sensor 11 of this embodiment. FIG. 10 is an exploded assembly view of the acoustic sensor 11 according to this embodiment. Note that, in FIG. 7, with regard to a protecting membrane 231 in a fixed membrane 23 is shown only by its outline that is observed when the protecting membrane 231 is formed on the semiconductor substrate 21.

The acoustic sensor 11 shown in FIG. 7 to FIG. 10 is different from the acoustic sensor 11 shown in FIG. 5 in that the vibrating membrane 22 and the fixed membrane 23 are further extended sideward from a base portion, and the fixed membrane 23 includes a fixed electrode 230 which is divided in a different manner, and is similar thereto in other components.

In the fixed electrode 230 in the fixed membrane 23 includes, in place of the peripheral electrode 230b, an extended electrode 230c in a sideward extended portion which is extended sideward. That is, the fixed electrode 230 is divided into a main electrode 230a and the extended electrode 230c. In a similar manner, in place of the contact portion 27b, the wiring strip 28b, and the connection terminal 29b, a contact portion 27c, a wiring strip 28c, and a connection terminal 29c are provided. Note that the vibrating electrode 220 is connected to the connection terminal 26 through the contact portions 24 and the wiring strip 25.

In the vibrating membrane 22, the base portion is wider than the sideward extended portion. Moreover, in the vibrating membrane 22, the base portion is fixed at fixed portions 51a on tips of respective extended portions 51, and the sideward extended portion is fixed at fixed portions 52a in respective edge portions 52 in upper and lower sides (when see in FIG. 9). The edges of the vibrating membrane 22 have unfixed portions, which serve as gaps (vent holes). That is, the vibrating membrane 22 is configured such that a ratio of an area of the fixed portions 51a of the base portion with respect to an area of the base portion is smaller than a ratio of an area of the fixed portions 52a of the sideward extended portion with respect to an area of the sideward extended portion. Accordingly, this causes the base portion to be displaced more than the sideward extended portion. In the example of FIG. 9, the fixed portion 51a on a lower right side and the fixed portion 52a on a lower side are connected to each other.

Figure 11:
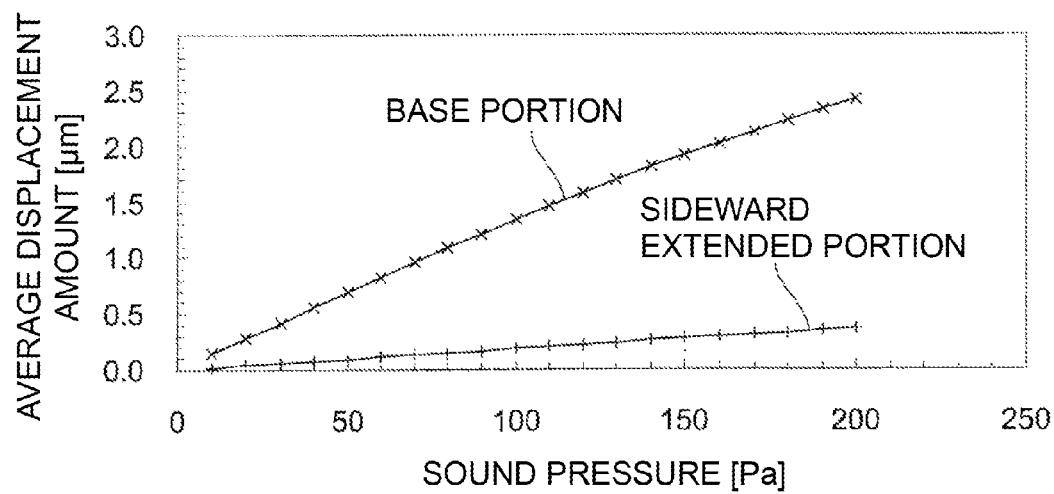
FIG. 11 is a graph showing a change of an average displacement amount of the vibrating membrane with respect to a sound pressure applied to the vibrating membrane in the acoustic sensor.

FIG. 11 shows a graph illustrating a change of an average displacement amount of each portion of the vibrating membrane 22 in response to the sound pressure applied to the vibrating membrane 22. Note that a unit of the sound pressure is Pa, and that a unit of the average displacement amount is µm. Referring to FIG. 11, it can be understood that the base portion has a larger average displacement amount than the sideward extended portion. Hence, the base portion of the vibrating membrane 22 and of the main electrode 230a of the fixed membrane 23 form a variable capacitor which functions as a high-sensitivity capacitor capable of favorably detecting a small sound.

The graph in FIG. 11 shows that a graph line representing the average displacement amount of the base portion in response to the sound pressure inclines at a constant degree until the sound pressure reaches 120 Pa, but declines at gradually decreasing degrees when the sound pressure exceeds 120 Pa. On the other hand, a graph line representing the average displacement amount of the sideward extended portion in response to the sound pressure inclines at a constant degree until the sound pressure reaches 200 Pa. Hence, the sideward extended portion of the vibrating membrane 22 and the extended electrode 230c of the fixed membrane 23 forms a variable capacitor which functions as a low-sensitivity variable capacitor capable of favorably detecting a large sound.

Furthermore, the vibrating membrane 22 has a slit 221 formed so as to be facing a boundary region between the main electrode 230a and the extended electrode 230c in the fixed membrane 23. Since the slit 221 is formed only in a part of the vibrating membrane 22 that faces the boundary region, the base portion and the sideward extended portion are physically and electrically connected to each other.

Incidentally, in the case where the slit 221 is not formed, the base portion and the sideward extended portion are adjoined with each other, and accordingly, the displacement of the base portion and the displacement of the sideward extended portion affect each other. As opposed to this, in this embodiment, since the slit 221 is formed, the base portion and the sideward extended portion are separated from each other, which results in a more significant a difference between the displacements of the base portion and the sideward extended portion.

Moreover, in the case where the opening 31 and the air gap have different air pressures, the air flows from the opening 31 to the air gap through the slit 221, or vice versa, which reduces the difference between the air pressures of the opening 31 and the air gap. Hence, it is possible to reduce a variation of the characteristics of the acoustic sensor 11 that is caused by the changes of the air pressure, and also to reduce a variation of the characteristics, noise and the like, caused by changes of an external fluid such as noise by a wind.

Note that, if a width of the slit 221 is too wide, then a ventilation effect is intensified, and an amount of the air going through the slit 221 becomes too large, which may result in a drop of a roll-off frequency that deteriorates the low-frequency characteristics. A description is made below of this point in detail.

Figure 12:
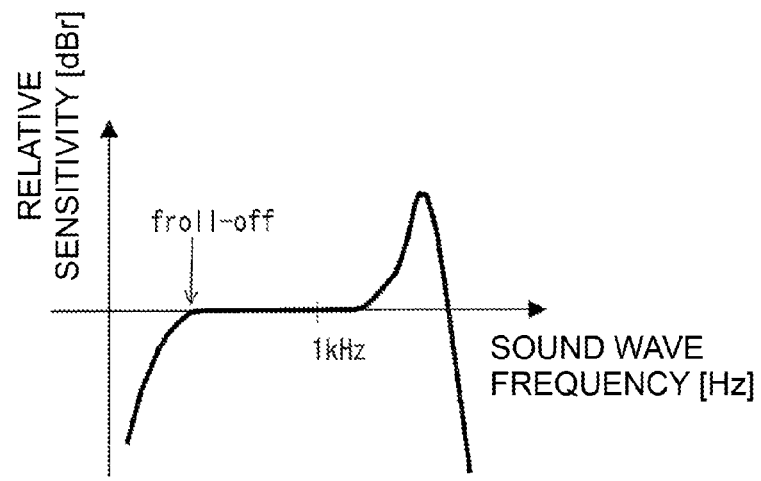
FIG. 12 is a graph showing typical frequency characteristics in the MEMS microphone.

FIG. 12 shows typical frequency characteristics of the MEMS microphone. A vertical axis in FIG. 12 represents a frequency (unit: Hz) of the sound wave, and a horizontal axis represents a relative sensitivity (unit: dBr). In a range where a graph line is horizontal, the relative sensitivity does not depend on the frequency of the sound wave and therefor the sound wave can be detected favorably. A lower limit frequency in this range is a roll-off frequency $f_{roll\text{-}off}$.

In general, the roll-off frequency $f_{roll\text{-}off}$ depends on an acoustic resistance $R_{venthole}$ of the ventilation hole and a compliance of the air (air spring constant) $C_{backchamber}$ in the back chamber (opening 31), and is represented by the following expression.

$$f_{roll\text{-}off} \propto 1/(R_{venthole} \times C_{backchamber}) \quad (1)$$

The acoustic resistance $R_{venthole}$ becomes smaller as a width of the slit becomes larger, although the acoustic resistance $R_{venthole}$ is also affected by a length of the slit 221 Hence, in accordance with the expression (1), the roll-off frequency $f_{roll\text{-}off}$ becomes larger, so that the low frequency characteristics are deteriorated. For example, if the width of the slit 221 is 1 µm, then the roll-off frequency $f_{roll\text{-}off}$ is 50 Hz or less; however, if the width of the slit 221 is 10 µm, then the roll-off frequency $f_{roll\text{-}off}$ is no less than 500 Hz. Therefore, if the width of the slit 221 exceeds 10 µm, the flow frequency characteristics are remarkably deteriorated, and the sound quality is impaired. Hence, it is desirable that the width of the slit 221 be 10 µm or less.

Fifth Embodiment

Figure 13:
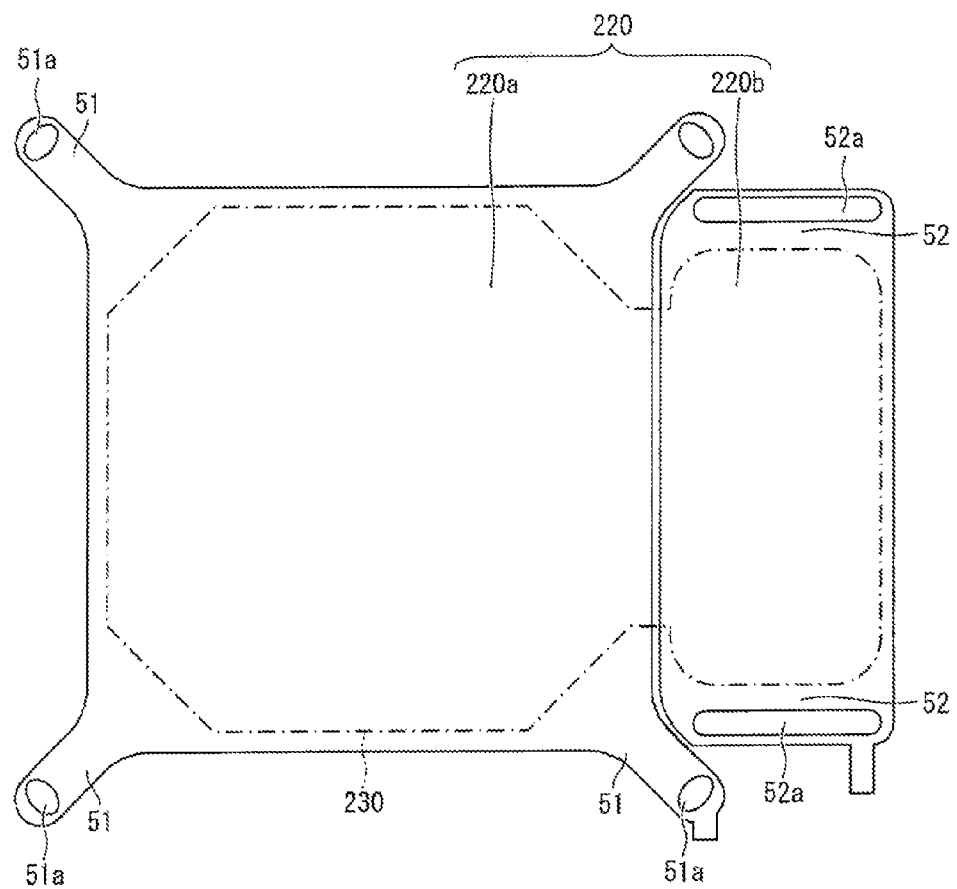
FIG. 13 is a plan view showing a schematic configuration of a vibrating membrane in an acoustic sensor of a MEMS microphone according to another embodiment of the present invention.
Figure 14:
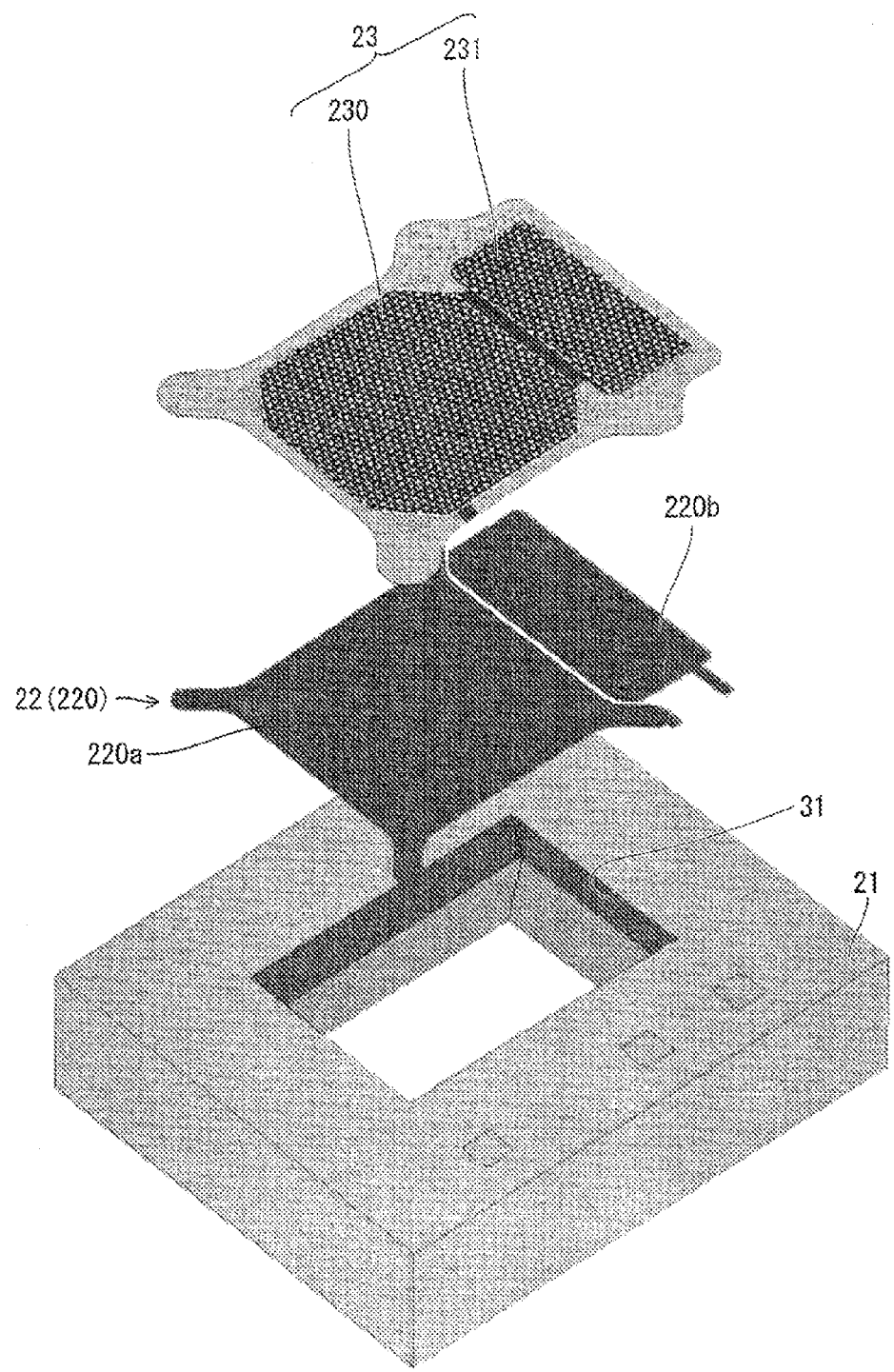
FIG. 14 is an exploded assembly view of the acoustic sensor.

Next, a description will be made of another embodiment of the present invention with reference to FIG. 13 and FIG. 14. FIG. 13 is a plan view showing a schematic configuration of a vibrating membrane 22 in an acoustic sensor 11 according to this embodiment, and FIG. 14 is an exploded assembly view of the acoustic sensor 11 according to this embodiment.

The acoustic sensor 11 of this embodiment is different from the acoustic sensor 11 shown in FIG. 7 to FIG. 10 in that the main electrode 230 *a* and extended electrode 230 *c* of the fixed electrode 230 are connected to each other whereas the vibrating electrode 220 is divided into the main electrode 220 *a* on a base portion and the extended electrode 220 *b* on the sideward extended portion. The acoustic sensor 11 of this embodiment is similar to the acoustic sensor 11 shown in FIG. 7 to FIG. 10 in other components. As described above, the vibrating electrode 220 can be divided. In this case, the main electrode 220 *a* and the extended electrode 220 *b* are connected to the amplifiers 121 and 122 of the ASIC 12.

The present invention is not limited to the respective embodiments mentioned above, and is modifiable in various ways within the scope described in claims. Embodiments obtained by appropriately combining technical means individually disclosed in the different embodiments are also incorporated in the technical scope of the present invention.

For example, in the embodiments described above, each of the sound hole portions 32 has a cross section that is circular; however, the sound hole portions may have a cross section in any shape, such as a triangle or a quadrangle.

Moreover, in some of the embodiments mentioned above, one of the vibrating electrode 220 and the fixed electrode 230 is divided into two; however, one of the vibrating electrode 220 and the fixed electrode 230 may be divided into three or more. However, if the number of divided electrodes is increased, then it is necessary to increase the numbers of components, such as wires for transmitting signals from the divided electrodes, and electrical circuits for processing the signals in the ASIC 12. This increases the sizes of the acoustic sensor 11 and the MEMS microphone 10. Hence, it is desirable that the number of divided electrodes be small, for example, two.

Moreover, both of the vibrating electrode 220 and the fixed electrode 230 may be divided. In this case, in response to the characteristics of the amplifiers 121 and 122 of the ASIC 12, the divided electrodes of one of the vibrating electrode 220 and the fixed electrode 230 only need to be connected to the amplifiers 121 and 122, and the divided electrodes of the other of the vibrating electrode 220 and the fixed electrode 230 may be short-circuited to each other. Alternatively, a plurality of charge pumps 120 of the ASIC 12 may be provided, and connected to each of the divided electrodes of one of the vibrating electrode 220 and the fixed electrode 230. Further, the divided electrodes of the other of the vibrating electrode and the fixed electrode may be respectively connected to the amplifiers 121 and 122.

As described above, in order to achieve the foregoing object, the acoustic transducer of the present invention includes a substrate; a vibrating membrane, provided above the substrate, including a vibrating electrode; and a fixed membrane, provided above the substrate, including a fixed electrode, the acoustic transducer detecting a sound wave according to changes in capacitances between the vibrating electrode and the fixed electrode, converting the sound wave into electrical signals, and outputting the electrical signals, at least one of the vibrating electrode and the fixed electrode being divided into a plurality of divided electrodes, and the plurality of divided electrodes outputting the electrical signals.

In accordance with the above configuration, at least one of the vibrating electrode and the fixed electrode is divided into a plurality of divided electrodes, whereby the plurality of variable capacitors are formed between the vibrating electrode and the fixing electrode. This allows the plurality of divided electrodes to respectively output a plurality of electrical signals, so as to provide an acoustic transducer capable of converting the sound wave into the plurality of electrical signals.

Moreover, the plurality of variable capacitors are formed between the same vibrating membrane and the same fixed membrane. Hence, according to the present invention, the chips have similar variations between the detection sensitivities of the respective variable capacitors, in comparison with the conventional technique by which the pluralities of vibrating membranes and fixed membranes are provided independently. This makes it possible to reduce a variation between the chips with regard to the difference between the detection sensitivities of the variable capacitors. Moreover, the variable capacitors share the vibrating membrane and the fixed membrane. This makes it possible to reduce, in the chip, the mismatching in the acoustic characteristics such as the frequency characteristics and the phase.

Preferably, the variable capacitors have respective different detectable sound pressure levels. This allows the acoustic sensor including the plurality of variable capacitors to have an increased detectable sound pressure level, in comparison with the conventional acoustic sensor including only one variable capacitor.

In order to differentiate the detectable sound pressure levels of the respective variable capacitors from each other, at least two of the plurality of divided electrodes may be configured to have different detection sensitivities for the sound wave.

Alternatively, at least two of the plurality of divided electrodes may be configured to have respective different areas. Moreover, a region of the vibrating membrane corresponding to a larger one of said at least two of the plurality of divided electrodes which have the respective different areas vibrates, in response to the sound wave, with a greater average amplitude than a region of the vibrating membrane corresponding to a smaller one of said at least two of the plurality of divided electrodes which have the respective different areas. This allows the variable capacitors to have detectable sound pressure levels which differ from each other more greatly, thereby allowing the acoustic sensor to have a further increased detectable sound pressure levels.

Moreover, where the electrode is divided into a greater number of divided electrodes, it is necessary to increase the number of components, such as wires for transmitting signals from the divided electrodes and electrical circuits for processing the signals. This increases the sizes of the acoustic sensor and the microphone. Hence, it is desirable that the number of the plurality of divided electrodes be a small number, for example, two.

Preferably, the acoustic transducer according to the present invention, is configured such that the vibrating electrode and the fixed electrode are disposed at a certain interval. According to this configuration, since the variable capacitors are provided in the same interval between the vibrating electrode and the fixed electrode, it is possible to further reduce, in the chip, the mismatching in the acoustic characteristics. Moreover, according to this configuration, it is possible to simplify a step of forming the vibrating electrode and the fixed electrode in the manufacturing process of the acoustic transducer.

Preferably, the acoustic transducer according to the present invention, is configured such that one of the vibrating electrode and the fixed electrode is divided into a plurality of divided electrodes. In comparison with a configuration in which both of the vibrating electrode and the fixed electrode are divided into divided electrodes, this configuration has less connections with an external circuit, so that productivity is enhanced. Moreover, according to this embodiment, the number of connection terminals to outside is decreased. This makes it possible to reduce a parasitic capacitance caused by the connection terminals, so as to improve the characteristics. Moreover, only a single voltage is necessary to be applied to the variable capacitors from an external charge pump. This makes it possible to reduce the size of the external circuit including the charge pump, to reduce a manufacturing cost, and to reduce a variation in the difference between the detection sensitivities, the variations being caused by variations of the external charge pumps made in their fabricating processes.

It is possible to achieve similar effects to the above, even if both of the vibrating electrode and the fixed electrode are divided into a plurality of divided electrodes, as long as the plurality of divided electrodes of one of the vibrating electrode and the fixed electrode are electrically short-circuited to each other.

Preferably, the acoustic transducer according to the present invention is configured such that each of the vibrating electrode and the fixed electrode has a uniform thickness. This configuration allows the chips to have more similar variations between the detection sensitivities of the variable capacitors, the variations being caused in fabrication. This makes it possible to further reduce the variation between the chips with regard to the differences in detection sensitivities of the variable capacitors.

Preferably, the acoustic transducer according to the present invention may be configured such that the vibrating membrane has a base portion shaped in a rectangle or square. Accordingly, this configuration allows effective use of an upper area of the chip. Moreover, in comparison with the vibrating membrane having a circular base portion, the vibrating membrane having the square base portion allows to change in more various ways, the fixed portion via which the vibrating membrane and the substrate are fixed to each other. This makes it possible to change the detection sensitivity variously. Moreover, in comparison with the vibrating membrane having the circular base portion, the vibrating membrane having the square base portion deforms in a substantial plate shape and substantially in parallel with the fixed membrane upon arrival of the sound wave at the vibrating membrane. Therefore, the variable capacitor functions as a capacitor similar to a parallel plate capacitor, which is made of electrodes disposed at an interval being variable depending on a sound pressure. As a result, a change of the capacitance has good linearity with respect to the sound pressure.

The acoustic transducer according to the present invention may be configured such that the vibrating membrane has a base portion shaped in a circle. In comparison with the vibrating membrane having the base portion shaped in a rectangle or a square, the vibrating membrane having the base portion shaped in a circle can reduce stress concentrated thereto. This makes is possible to enhance durability against an external stress and an internal stress.

Preferably, the acoustic transducer according to the present invention is configured such that the vibrating membrane has an extended portion extended outward from the base portion, and the vibrating membrane is fixed to the substrate or the fixed membrane at the extended portion. In this configuration, it is possible to increase a displacement amount of the vibrating membrane.

The acoustic transducer according to the present invention may be configured such that when the vibrating electrode is divided into a plurality of divided electrodes, the vibrating membrane has a slit which is formed in a boundary region between the plurality of divided electrodes; and in a case where the fixed electrode is divided into a plurality of divided electrodes, the vibrating membrane has a slit which is formed so as to face a boundary between the plurality of divided electrodes. The slit increases a difference in displacement amounts of parts of the vibrating membrane which parts correspond to the respective variable capacitors, thereby making it possible to increase the difference between the detection sensitivities of the variable capacitors. Moreover, the slit allows the air to go in and out therethrough. This makes it possible to control changes of the air pressure caused by the vibration of the vibrating membrane, thereby making it possible to reduce a variation of the characteristics caused by the changes of the air pressure.

Preferably, the acoustic transducer of the present invention is configured such that the slit has a width of 10 µm or less. this makes it possible to prevent significant deterioration of low frequency characteristics.

Preferably, the acoustic transducer according to the present invention is configured such that the vibrating membrane and the substrate are separated by a gap. In comparison with a configuration in which a gap is not present, this configuration makes it possible to increase a displacement amount of the vibrating membrane, thereby improving the detection sensitivity. Moreover, even if the substrate is warped by external force and the like, the vibrating membrane in such a configuration is less likely to be warped, and accordingly, the acoustic characteristics are less likely to be varied. Moreover, this configuration makes it possible to reduce an influence by variations of an outside air pressure.

The acoustic transducer according to the present invention is configured such that the vibrating membrane has a plurality of regions corresponding to the plurality of divided electrodes, and at least two of the plurality of corresponding regions have their respective fixed portions at which the vibrating membrane is fixed to the substrate or the fixed membrane; and a ratio of an area of one of said at least two of the plurality of corresponding regions with respect to an area of its respective fixed portion is different from a ratio of an area of the other of said at least two of the plurality of corresponding regions with respect to an area of its respective fixed portion.

In general, the displacement of the vibrating membrane changes depending on how the fixed portions are formed. For example, as the number of fixed portions increases, the vibrating membrane is displaced in response to sound pressure in a smaller amount and accordingly the detection sensitivity becomes smaller. Hence, in the above configuration, since the plurality of variable capacitors have different area ratios, the plurality of variable capacitors have different detection sensitivities.

The acoustic transducer according to the present invention is configured such that the substrate has an opening facing a center of the vibrating membrane, and the sound wave enters the acoustic transducer through the opening. According to this configuration, the opening is shared by the variable capacitors. Therefore, it is possible to further reduce, in the chip, the mismatching in the acoustic characteristics such as the frequency characteristics and phases. Moreover, in comparison with a configuration in which the sound wave enters the acoustic transducer through the fixed membrane, this configuration makes it possible to reduce deteriorations of the sensitivity and the frequency characteristics due to a volume effect of the opening.

Note that it is possible to achieve similar effects to the above by a microphone including the acoustic transducer having the above configuration, and an integrated circuit (IC) that supplies power to the acoustic transducer and amplifies electrical signals from the acoustic transducer to output the electrical signals to outside.

As described above, in the acoustic transducer according to the present invention, at least one of the vibrating electrode and the fixed electrode is divided, whereby the plurality of variable capacitors will be formed between the vibrating electrode and the fixed electrode. Accordingly, such an effect is achieved that the acoustic transducer can be realized, which is capable of converting the sound wave into a plurality of electrical signals by outputting the plurality of electrical signals from the plurality of divided electrodes, respectively. Moreover, the plurality of variable capacitors are formed in the same vibrating membrane and fixed membrane. Accordingly, such effects are achieved that the variations among the chips with regard to the differences in detection sensitivity among the variable capacitors are suppressed, and that the mismatching in the chip with regard to the acoustic characteristics such as the frequency characteristics and the phase is suppressed.

As described above, in accordance with the acoustic transducer according to the present invention, the acoustic transducer capable of converting the sound wave into the plurality of electrical signals is realized in the same vibrating membrane and fixed membrane. Accordingly, since the variation of the acoustic characteristics can be suppressed, the acoustic transducer according to the present invention can be applied to an arbitrary MEMS-type acoustic sensor.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An acoustic transducer, comprising:
a substrate having an opening that is configured to receive a sound wave;
a vibrating electrode provided adjacent to the opening in the substrate, the vibrating electrode having:
a first vibrating portion;
a second vibrating portion that is smaller than the first vibrating portion, the second vibrating portion extending from one side of the first vibrating portion;
a continuous slit partially between the first vibrating portion and the second vibrating portion of the vibrating electrode;
a first anchor portion and a second anchor portion coupled between the first vibrating portion and the second vibrating portion, the continuous slit extending between and aligned with the first and second anchor portion; and
a fixed membrane having a fixed electrode, the vibrating and the fixed electrode being configured to output electrical signals based on changes in capacitances between the vibrating electrode and the fixed electrode in response to the sound wave.

2. The acoustic transducer according to claim 1 wherein the vibrating electrode and the fixed electrode are separated from each other by a distance during a resting state, the distance being configured to change during an operational state in response to the sound wave.

3. The acoustic transducer according to claim 1 wherein:
the fixed electrode is divided into a group of divided electrodes.

4. The acoustic transducer according to claim 1 wherein each of the vibrating electrode and the fixed electrode has a uniform thickness.

5. The acoustic transducer according to claim 1 wherein the vibrating electrode and the substrate are separated by a gap.

6. The acoustic transducer according to claim 1 wherein:
the first vibrating portion and the second vibrating portion have fixed portions at which the vibrating electrode is fixed to the substrate, the fixed portions including the first anchor portion and the second anchor portion; and
a ratio of an area of the first vibrating portion with respect to an area of the respective fixed portion is different from a ratio of an area of the second vibrating portion with respect to an area of the respective fixed portion.

7. The acoustic transducer according to claim 1 wherein the opening faces a center of the first vibrating electrode.

8. The acoustic transducer of claim 1 wherein the fixed membrane includes a first fixed portion and a second fixed portion that are separated by a dielectric portion in the fixed membrane.

9. The acoustic transducer of claim 1 wherein the continuous slit of the vibrating electrode faces a boundary between the first vibrating portion and the second vibrating portion.

10. The acoustic transducer of claim 1 wherein the substrate is a semiconductor substrate and the vibrating electrode is positioned between the substrate and the fixed membrane.

11. The acoustic transducer according to claim 1 wherein the fixed electrode includes at least two divided electrodes have different areas.

12. The acoustic transducer according to claim 11 wherein the fixed electrode includes a first fixed portion and a second fixed portion, the first vibrating portion of the vibrating electrode corresponds to the first fixed portion that is larger than the second fixed portion and is configured to vibrate, in response to the sound wave, with a greater average amplitude than the second vibrating portion of the vibrating electrode.

13. The acoustic transducer according to claim 1 wherein the fixed electrode includes a first fixed portion and a second smaller fixed portion, the first vibrating portion and the second vibrating portion are aligned with the first and second fixed portions, respectively.

14. The acoustic transducer according to claim 13 wherein the first fixed portion and the second fixed portion are partially separated by a slit.

15. The acoustic transducer according to claim 1 wherein:
the plurality of divided electrodes includes the first vibrating portion and the second vibrating portion, which are separated by a slit in a boundary between the vibrating portions.

16. The acoustic transducer according to claim 15 wherein the continuous slit has a width of 10 um or less.

17. The acoustic transducer according to claim 1 wherein the first vibrating portion is a rectangle.

18. The acoustic transducer according to claim 17 wherein the second vibrating portion is a rectangle that has a smaller width than a width of the first vibrating portion.

19. The acoustic transducer according to claim 17 wherein:
the vibrating electrode has extensions that extend away from the first vibrating portion and from the second vibrating portion; and
the vibrating electrode is fixed to the substrate with the extensions.

20. A microphone, comprising:
an acoustic transducer that includes:
a substrate having an opening that is configured to receive a sound wave;
a vibrating electrode, provided adjacent to the opening in the substrate, the vibrating electrode having:
a first vibrating portion and a second vibrating portion that is smaller than the first vibrating portion, the second vibrating portion extending from one side of the first vibrating portion;
a continuous slit partially between the first vibrating portion and the second vibrating portion of the vibrating electrode; and
a first anchor portion and a second anchor portion coupled between the first vibrating portion and the second vibrating portion, the continuous slit extending between and aligned with the first and second anchor portions; and
a fixed membrane, provided adjacent to the opening in the substrate, the fixed membrane including a fixed electrode, the vibrating electrode and the fixed electrode being configured to output electrical signals based on changes in capacitances between the vibrating electrode and the fixed electrode in response to the sound wave;
an integrated circuit configured to supply electric power to the acoustic transducer, to receive the electrical signals from, to amplify the electrical signals from the acoustic transducer, and to externally output the electrical signals.

21. The microphone of claim 20 wherein the fixed membrane includes a first fixed portion and a second fixed portion.

22. The microphone of claim 21 wherein the first fixed portion is partially separated from the second fixed portion by a slit.

23. The microphone of claim 21 wherein the first fixed portion is completely separated from the second fixed portion by a slit.

24. The microphone of claim 21 wherein the first fixed portion is larger than the second fixed portion.

25. The microphone of claim 24 wherein the first vibrating portion and the first fixed portion have a rectangular shape and the second vibrating portion and the second fixed portion have a rectangular shape that has a width that is smaller than a width of the first vibrating portion and the first fixed portion.

26. A device, comprising:
a substrate having an opening; and
a vibrating electrode coupled to the substrate, the vibrating electrode having a first vibrating portion and a second vibrating portion that extends from one side of the first vibrating portion, the first vibrating portion and the second vibrating portion being suspended adjacent to the opening, the first vibrating portion being partially separated from the second vibrating portion by a continuous gap that extends from a first location and a second location, the first location being at a first end of the continuous gap, the second location being at a second end of the continuous gap, the second vibrating portion is mechanically coupled to the first vibrating portion at the first end and the second end of the continuous gap, and the first vibrating portion being larger than the second vibrating portion.

27. The device of claim 26 wherein the first vibrating portion is rectangular and has a first width, and the second vibrating portion is rectangular and has a second width that is smaller than the first width.

28. The device of claim 26 wherein the vibrating electrode includes a plurality of anchoring portions that extend from the first vibrating portion and the second vibrating portion, the anchoring portions configured to attach the vibrating electrode to the substrate.

29. An acoustic transducer, comprising:
a substrate having an opening;
a vibrating electrode adjacent to the opening in the substrate, the vibrating electrode having a first vibrating portion and a second vibrating portion that is smaller than the first vibrating portion, the second vibrating portion extending from one side of the first vibrating portion, the first vibrating portion and the second vibrating portion are completely separated by a slit; and
a fixed membrane having a fixed electrode, the vibrating and fixed electrodes being configured to output electrical signals based on changes in capacitances between the vibrating electrode and the fixed electrode in response to the sound wave.

30. The acoustic transducer according to claim 29 wherein the fixed electrode includes a first fixed portion and a second fixed portion that are separated by a slit.

31. A microphone, comprising:
an acoustic transducer that includes:
a substrate having an opening;
a vibrating electrode adjacent to the opening in the substrate, the vibrating electrode having a first vibrating portion and a second vibrating portion that is smaller than the first vibrating portion, the second vibrating portion extending from one side of the first vibrating portion, the first vibrating portion being completely separated from the second vibrating portion by a slit; and
a fixed membrane adjacent to the opening in the substrate, the fixed membrane including a fixed electrode; and
an integrated circuit configured to supply electric power to the acoustic transducer, to receive electrical signals from vibrating electrode and the fixed electrode, to amplify the electrical signals from the acoustic transducer, and to externally output the electrical signals.

32. The microphone of claim 31 wherein the fixed membrane includes a first fixed portion and a second fixed portion.

* * * * *